United States Patent
Seo

(10) Patent No.: US 8,188,582 B2
(45) Date of Patent: May 29, 2012

(54) LEAD FRAME, SEMICONDUCTOR DEVICE USING THE LEAD FRAME, AND METHODS OF MANUFACTURING THE SAME

(75) Inventor: Jang-Mee Seo, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 270 days.

(21) Appl. No.: 12/081,566

(22) Filed: Apr. 17, 2008

(65) Prior Publication Data

US 2008/0258280 A1    Oct. 23, 2008

(30) Foreign Application Priority Data

Apr. 19, 2007    (KR) .................. 10-2007-0038316

(51) Int. Cl.
*H01L 23/495* (2006.01)

(52) U.S. Cl. ........ 257/676; 257/666; 257/694; 257/695; 257/E23.037; 257/E23.043

(58) Field of Classification Search .................. 257/676, 257/695, 694, E23.037, E23.043, 666
See application file for complete search history.

(56) References Cited

U.S. PATENT DOCUMENTS

| | | | |
|---|---|---|---|
| 5,468,993 A | 11/1995 | Tani | |
| 5,783,463 A | 7/1998 | Takehashi et al. | |
| 5,914,528 A * | 6/1999 | Takiar et al. | 257/666 |
| 6,608,375 B2 * | 8/2003 | Terui et al. | 257/691 |
| 2002/0113304 A1 * | 8/2002 | Doh et al. | 257/686 |
| 2006/0017142 A1 * | 1/2006 | Jang et al. | 257/672 |
| 2008/0067640 A1 * | 3/2008 | Do et al. | 257/666 |

FOREIGN PATENT DOCUMENTS

| | | |
|---|---|---|
| JP | 05-226564 | 9/1993 |
| JP | 10-092858 | 4/1998 |
| JP | 2006-165448 | 6/2006 |
| KR | 10-0149798 | 11/1995 |
| KR | 10-0149798 | 6/1998 |
| KR | 10-2001-0053792 A | 7/2001 |

(Continued)

OTHER PUBLICATIONS

Decision of Grant issued on Dec. 16, 2008 in corresponding Korean Patent Application No. 10-2007-0038316.

(Continued)

*Primary Examiner* — N Drew Richards
*Assistant Examiner* — Yu-Hsi D Sun
(74) *Attorney, Agent, or Firm* — Harness, Dickey & Pierce, P.L.C.

(57) ABSTRACT

Provided are a lead frame, semiconductor device, and methods of manufacturing the same. The lead frame may include a die pad having at least three pair of sides parallel with each other, and a plurality of inner leads spaced apart from a circumference of the die pad, arranged in a radial shape with respect to a center of the die pad, and having the ends form inner lead connection surfaces parallel with at least one pair of sides of the die pad. In addition, there may be provided a semiconductor device having the lead frame. Accordingly, a semiconductor chip may be positioned on a die pad. The plurality of inner leads may be electrically connected to the semiconductor chip through wires. The semiconductor device may further include a molding resin for surrounding top and bottom surfaces of the lead frame and filling in an interior thereof.

23 Claims, 9 Drawing Sheets

FOREIGN PATENT DOCUMENTS

KR    10-2001-0068510 A    7/2001

OTHER PUBLICATIONS

US 5,783,463 is submitted as a corresponding document to KR 10-0149798.

US 5,468,993 is submitted as a corresponding document to JP 05-226564.

Office Action dated Jul. 7, 2008 for corresponding Korean Application No. 10-2007-0038316.

* cited by examiner

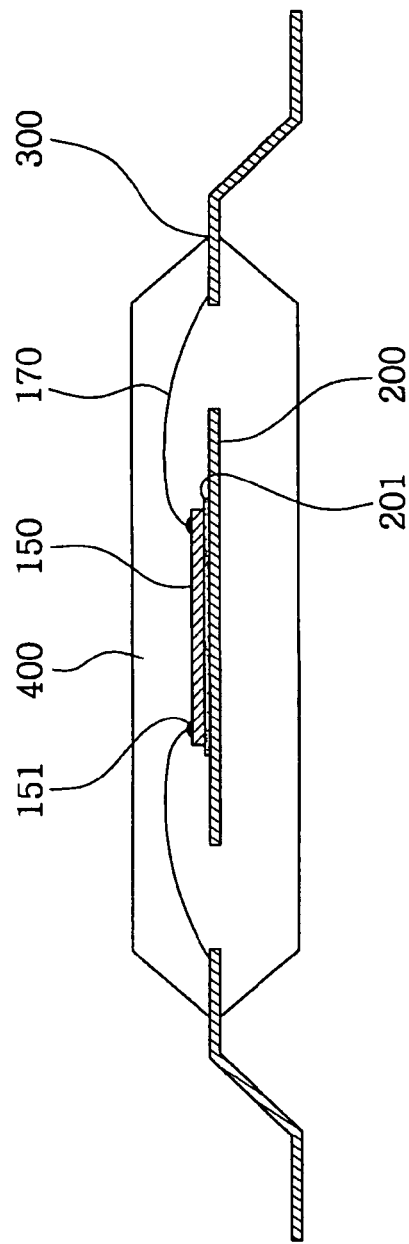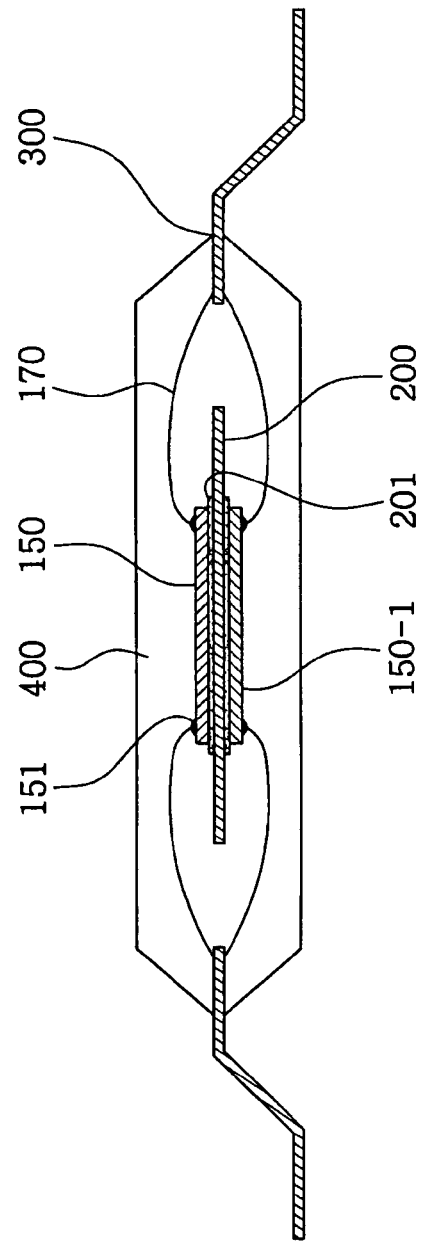

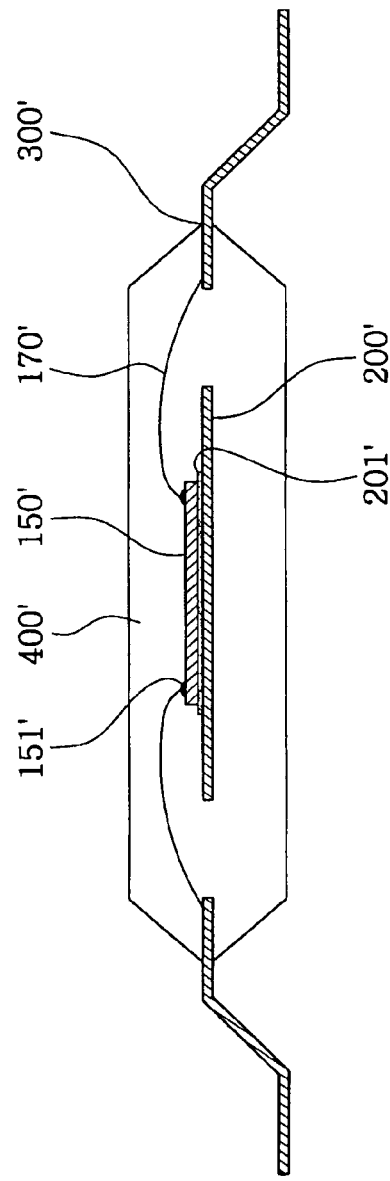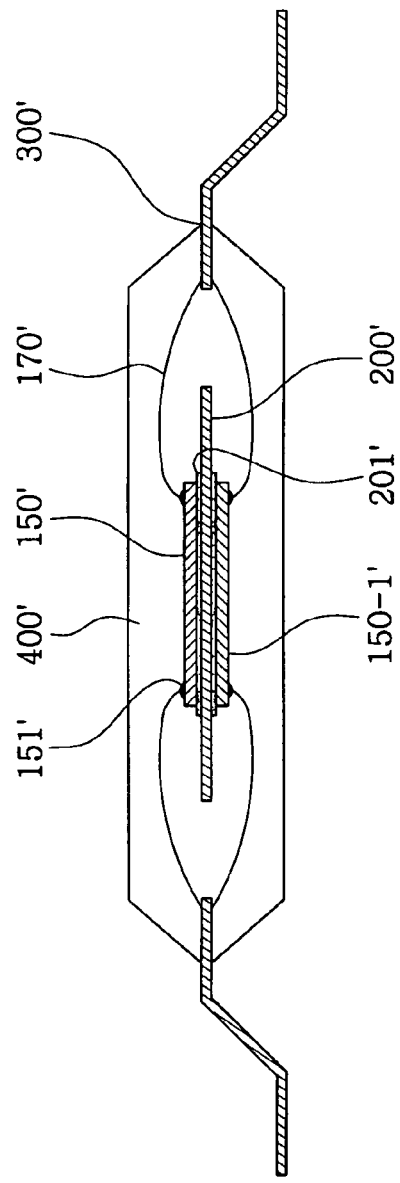

LEAD FRAME, SEMICONDUCTOR DEVICE USING THE LEAD FRAME, AND METHODS OF MANUFACTURING THE SAME

PRIORITY STATEMENT

This application claims priority under 35 U.S.C. §119 to Korean Patent Application No. 2007-0038316, filed on Apr. 19, 2007, with the Korean Intellectual Property Office (KIPO) the entire contents of which are herein incorporated by reference.

BACKGROUND

1. Technical Field

Example embodiments relate to a semiconductor device. Other example embodiments relate to a lead frame and a semiconductor device having a lead frame, wherein a semiconductor chip is positioned on a die pad by selectively rotating the semiconductor chip at a certain angle, the connection angles and lengths of wires for connecting the semiconductor chip and inner leads to each other are set to be constant. A molding resin may be coated on the lead frame to form a mold, so that the mold may be prevented from being distorted or lifted out of the lead frame. Other example embodiments relate to methods of manufacturing a lead frame and a semiconductor device.

2. Discussion of the Related Art

In general, semiconductor chips may be fabricated on a wafer by sequentially or repeatedly performing a plurality of unit processes, e.g., deposition, diffusion, exposure, etching, ion implantation and/or cleaning. Thus, a plurality of semiconductor chips may be fabricated on a wafer. Semiconductor chips may be arranged on a wafer in such a manner may be manufactured as a plurality of semiconductor devices through a package process. A semiconductor device may be manufactured as follows. A semiconductor chip may be die-bonded on one surface of a die pad attached to a lead frame. The semiconductor chip may be wire-bonded to leads arranged in a radial shape around the die pad with gold wires. Subsequently, the semiconductor chip and bonded portions thereof may be molded with a synthetic resin.

Recently, the size of a semiconductor chip has become smaller. Connection contact points provided at the edge of the semiconductor chip may be individually connected to the ends of a plurality of inner leads provided around a die pad with gold wires.

A conventional lead frame will be described with reference to FIG. 1. In FIG. 1, reference numeral 1 may denote a die pad, reference numeral 2 may denote a lead, reference numeral 3 may denote a semiconductor chip, and reference numeral 5 may denote a gold wire for electrically connecting an electrode pad of the semiconductor chip 3 to each lead 2.

When the semiconductor chip 3 is mounted on the lead frame, the preform material may be first provided on a central portion of the die pad 1 of the lead frame, the semiconductor chip 3 may then be adhered to the die pad 1 by applying pressure to the semiconductor chip 3 from the upper side of the chip 3. Typically, the semiconductor chip 3 may be formed by cutting a semiconductor wafer. The semiconductor chip 3 may be generally formed in the shape of a square. The shape of the die pad 1 may be generally formed to have a square larger than the semiconductor chip 3.

As the size of the semiconductor chip becomes smaller, the size of the die pad may become smaller, and the diameter of each wire for electrically connecting the die pad and the inner leads may also become smaller. Because the die pad may be formed in the shape of square, when the die pad is connected (e.g., die-attached) to the inner leads using the wires, the die attachment may be performed only at 0 or 90 degrees with respect to the inner leads of which the ends are arranged in parallel with the four surfaces of the die pad.

Therefore, when connection contact points formed along the die pad, which is becoming smaller, are connected to the inner leads using the wires, the angle and length between the wires may be reduced. For this reason, an electrical short phenomenon may be caused by a current flowing between the wires. Such a phenomenon may be caused on a corner portion between the semiconductor chip and the die pad.

The conventional lead frame may include isolation frames extending in four directions from the die pad. When the lead frame is molded using a molding resin, the molding resin may be molded to surround or enclose the semiconductor chip and the isolation frames. Accordingly, the molding resin may come into surface contact with the isolation frames, so that a bonding force between the top and bottom of the molding resin may be increased.

SUMMARY

Example embodiments provide a lead frame wherein, when rotating a semiconductor chip at a certain angle to be positioned on a die pad, wires connected to the semiconductor chip may be set to be perpendicular to inner lead connection surfaces of inner leads, so that an interference between the wires may be reduced, and a semiconductor device having the lead frame, and methods of manufacturing the same. Example embodiments provide a lead frame wherein, when coating the lead frame with a molding resin to form a mold, a plurality of locking holes may be provided in an isolation frame of the lead frame, so that a bonding force between the top and bottom of the molding resin around the lead frame may be increased, thereby preventing or reducing the mold from being lifted out of the lead frame.

In accordance with example embodiments, a lead frame may be provided. The lead frame may include a die pad having at least three pairs of sides parallel with each other; and a plurality of inner leads spaced apart from a circumference of the die pad, arranged in a radial shape with respect to a center of the die pad, and having the ends of the plurality of inner leads form connection surfaces that are parallel with at least one pair of sides of the die pad. The sides of the die pad may form an obtuse angle with each other.

Each of the inner lead connection surfaces of the inner leads formed at a position corresponding to any pair of sides of the die pad may be formed to be inclined with respect to the pair of sides of the die pad. The inner lead connection surfaces may form an obtuse angle with each other. The die pad may include a plurality of isolation frames extending by a length from the circumference of the die pad.

Locking holes may be provided with different sizes, passing through top and bottom surfaces of the isolation. The locking holes may be provided to be symmetric with respect to a central axis line of the isolation frame. The isolation frame may be at an angle to the side of the die pad. The locking holes may be provided with a length and to form an acute angle to the side of the die pad.

According to example embodiments, a semiconductor device having a lead frame may be provided. The semiconductor device may include a plurality of outer leads provided on an outer circumference of the semiconductor device, a die pad at a central portion of the lead frame, three or more pairs of sides parallel with each other, a semiconductor chip positioned on the die pad, the semiconductor chip having connection contact points may be formed on a top surface thereof. The sides of the die pad may form an obtuse angle with each other. Each of the inner lead connection surfaces of the inner leads formed on a position corresponding to any one pair of sides of the die pad may be formed to be inclined with respect to the pair of sides of the die pad. The inner lead connection surfaces may form an obtuse angle with each other. The connection contact points may be formed at two edge portions of the semiconductor chip.

The locking holes may be provided to be symmetric with respect to a central axis line of the isolation frame. The isolation frame may be at an angle to the side of the die pad. The locking holes may be provided to have a given length and to form an acute angle with the side of the die pad. Each of the wires may be at an angle to the inner lead connection surface of the inner leads. A die pad may be further positioned on the other surface of the lead frame. The die pad positioned on the other surface of the lead frame may further include outer leads, inner leads and isolation frames. The semiconductor device may further include a molding resin for surrounding top and bottom surfaces of the lead frame and filling in an interior thereof.

Example embodiments provide a method of manufacturing a lead frame. In a method of manufacturing a lead frame in accordance with example embodiments, a lead frame may include a die pad having at least three pairs of sides parallel with each other. Further, the lead frame may include a plurality of inner leads spaced apart from a circumference of the die pad, arranged in a radial shape with respect to a center of the die pad. The plurality of inner leads may form connection surfaces that are parallel with at least one pair of sides of the die pad. Each of the inner lead connection surfaces of the inner leads may be formed at a position corresponding to any one pair of the pair of the parallel sides of the die pad and inclined with respect to the pair of parallel sides of the die pad. The die pad may further include forming a plurality of isolation frames that extend by a length from the circumference of the die pad and locking holes of different sizes that pass through top and bottom surfaces of the isolation frame.

Example embodiments provide a method of manufacturing a semiconductor device having a lead frame. In a method of manufacturing a semiconductor device having a lead frame in accordance with example embodiments, a plurality of outer leads may be formed at an outer circumference of the semiconductor device. A lead frame with a die having at least three pairs of sides parallel with other and plurality of inner leads may be provided. A semiconductor chip positioned on the die pad may be provided. The semiconductor chip having connection contact points may be provided. A plurality of isolation frames may be formed by length from the circumference of the die pad to end portions of the lead frame.

BRIEF DESCRIPTION OF THE DRAWINGS

Example embodiments will be more clearly understood from the following detailed description taken in conjunction with the accompanying drawings. FIGS. 1-11 represent non-limiting, example embodiments as described herein.

FIG. 1 is a plan view of a conventional lead frame;

FIG. 2 is a plan view of a lead frame according to example embodiments;

FIG. 3 is a plan view of a semiconductor device having the lead frame according to example embodiments;

FIG. 4 is a plan view of another example of a locking hole according to example embodiments;

FIG. 5 is a cross-sectional view of the semiconductor device having the lead frame according to example embodiments;

FIG. 6 is a cross-sectional view of another example of the semiconductor device having the lead frame according to example embodiments;

FIG. 7 is a plan view of a lead frame according to example embodiments;

FIG. 8 is a plan view of a semiconductor device having the lead frame according to example embodiments;

FIG. 9 is a plan view of another example of a locking hole according to example embodiments;

FIG. 10 is a cross-sectional view of the semiconductor device having the lead frame according to example embodiments; and FIG. 11 is a cross-sectional view of another example of the semiconductor device having the lead frame according to example embodiments.

Figure 1:
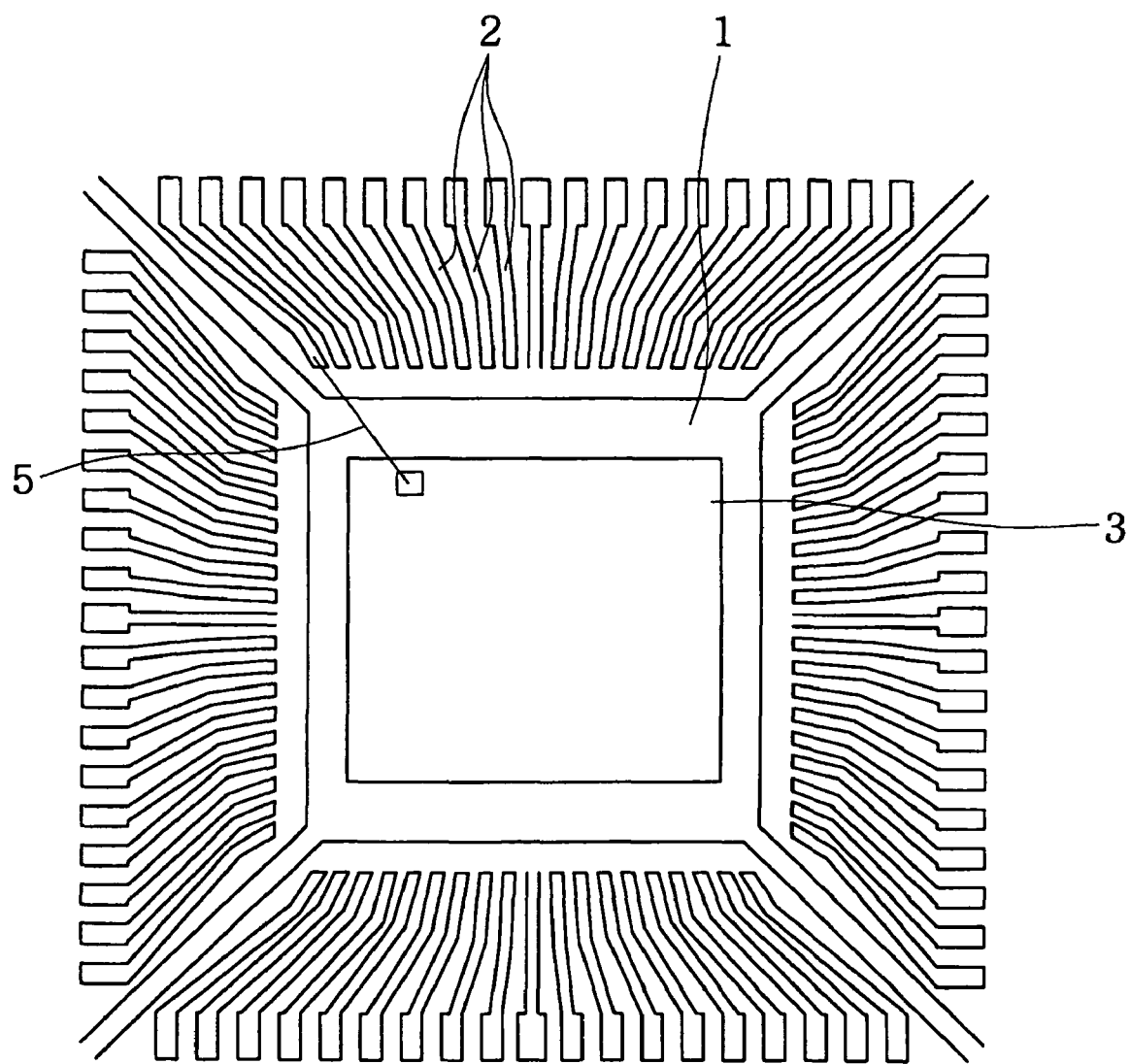

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein. Rather, these embodiments are provided so that this disclosure will be thorough and complete, and will fully convey the scope of example embodiments to those skilled in the art. In the drawings, the thickness of layers, films and regions are exaggerated for clarity. Like numbers refer to like elements throughout the specification.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to described various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g. "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

A lead frame and a semiconductor device having the same according to example embodiments will now be described more fully hereinafter with reference to the accompanying drawings.

Figure 2:
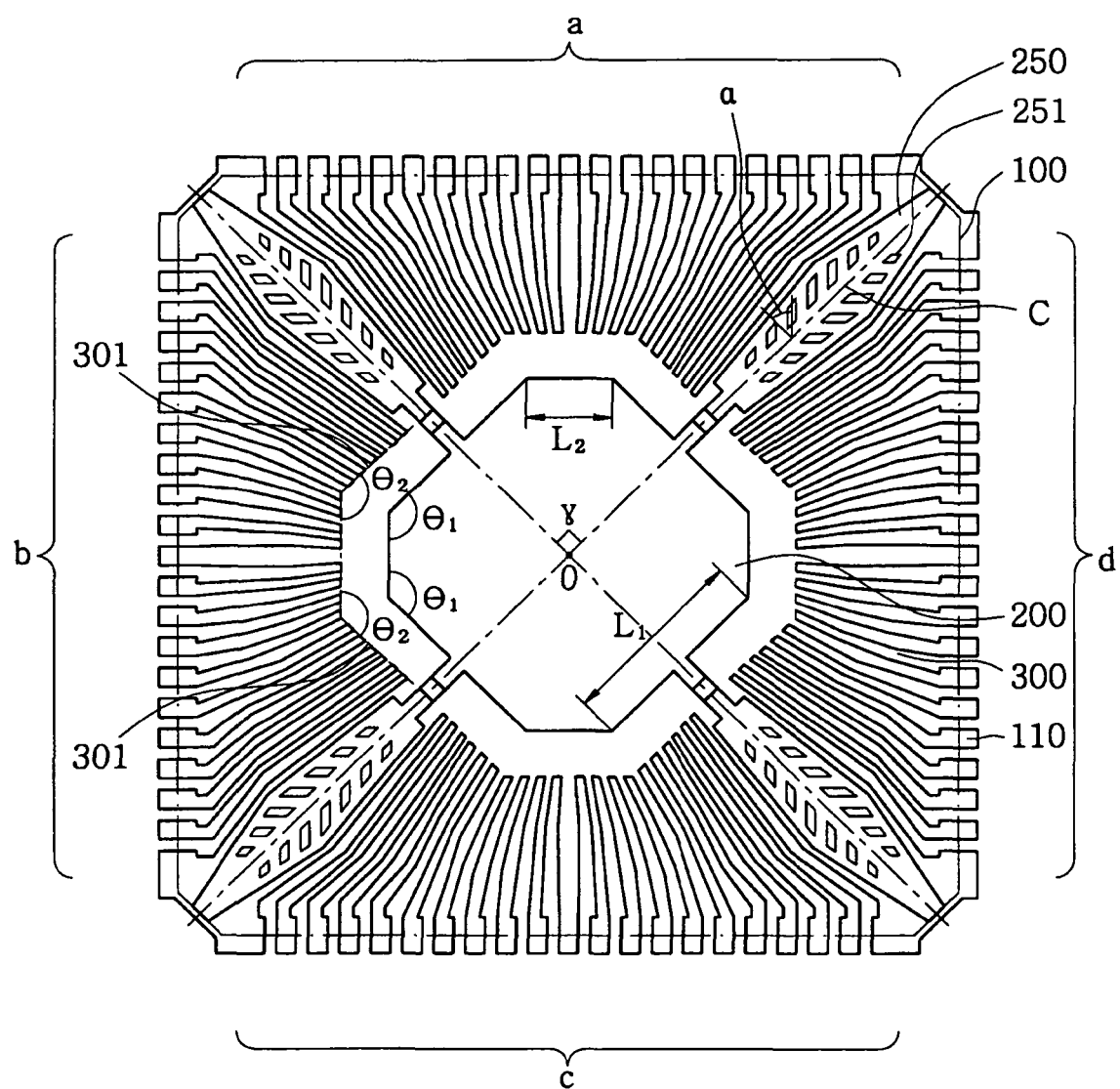
Figure 3:
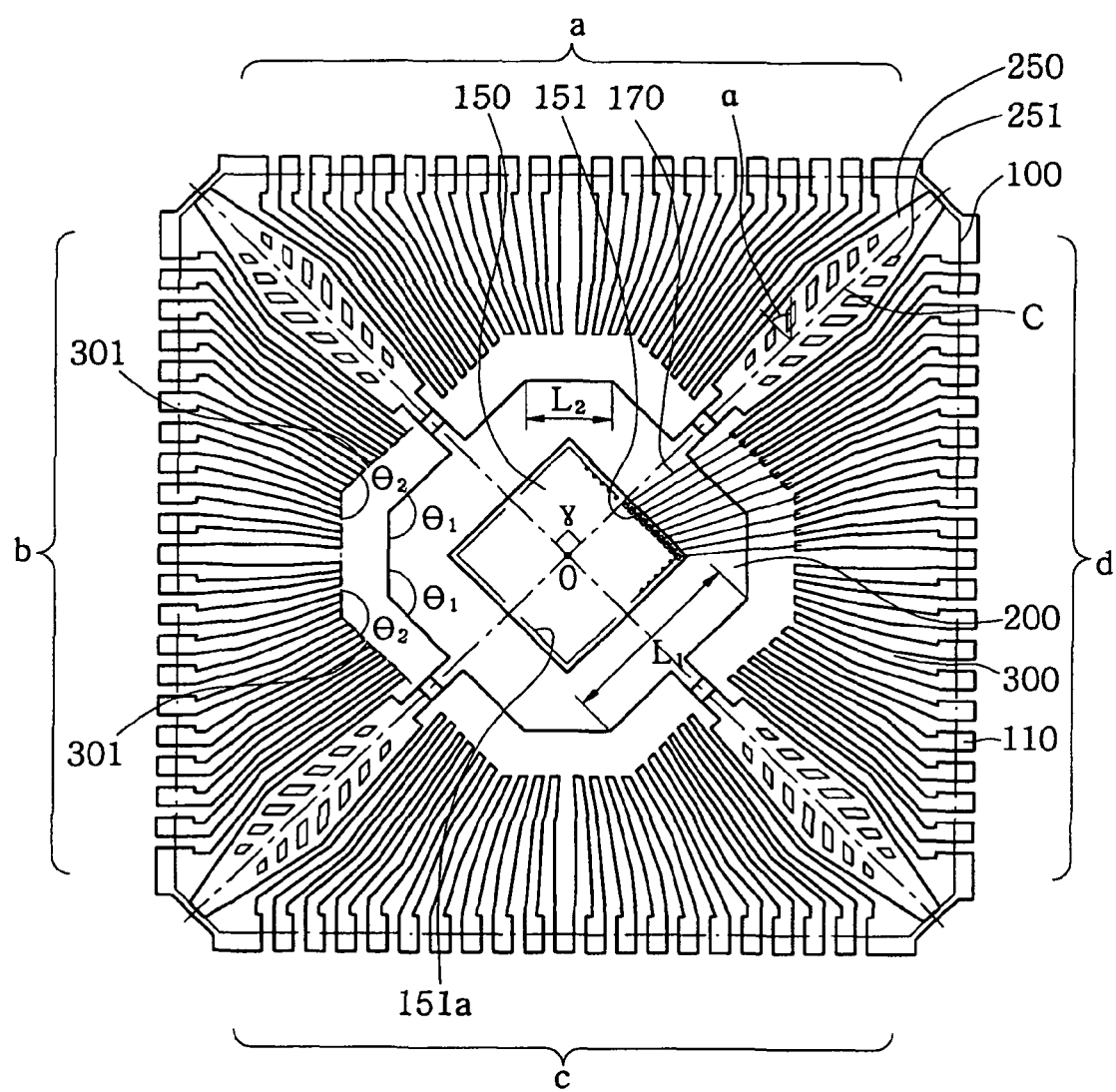
Figure 4:
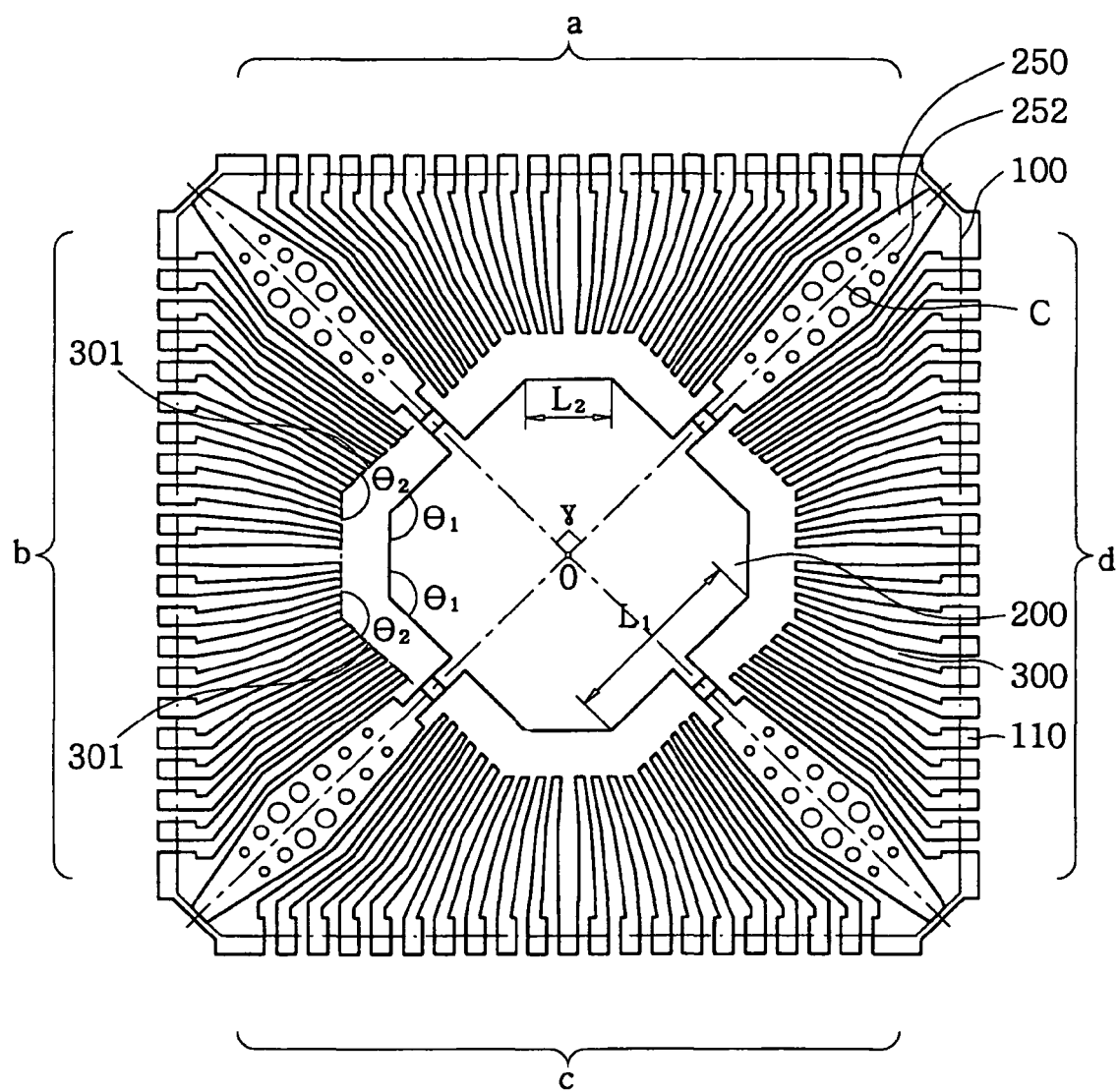

FIG. 2 is a plan view of a lead frame according to example embodiments. FIG. 3 is a plan view of a semiconductor device having a lead frame according example embodiments. FIG. 4 is a plan view of another example of locking holes according to example embodiments. FIG. 5 is a cross-sectional view of the semiconductor device having a lead frame according to example embodiments. FIG. 6 is a cross-sectional view of example embodiments of a semiconductor device having a lead frame.

The semiconductor device according to example embodiments will be described below with reference to FIGS. 2-6. Because a lead frame 100 according to example embodiments may be included in a semiconductor device, it will be described in the following description. Referring to FIG. 2, a semiconductor device according to example embodiments may have a lead frame 100 including a plurality of outer leads 110 provided on an outer circumference thereof. The lead frame 100 may be formed in the shape of a quadrangle or square having four surfaces.

A die pad 200 may be positioned on a central portion of the lead frame 100, and the die pad 200 may have three or more pairs of sides parallel with each other. A semiconductor chip 150 having connection contact points 151 thereon may be positioned on the die pad 200. Thus, for example, the die pad 200 may be formed in at least an hexagonal shape. Two pairs of parallel sides facing each other of the die pad 200 may have a first length L1, and each of the other two pairs of parallel sides may have a second length L2. The first length L1 may be equal to or different from the second length L2. For example, the first length L1 may be longer than the second length L2 as shown in FIGS. 2 and 3. The four pairs of parallel sides of the die pad 200 may form an obtuse angle $\theta1$ with each other.

A plurality of inner leads 300 may be provided along the circumference of the die pad 200, and the inner leads 300 may be spaced apart from the circumference of the die pad 200 at a given interval. The inner leads 300 may be arranged in a radial shape from a center O of the die pad 200. The inner leads 300 may have predetermined or given lengths to be connected to outer leads 110. One end of the inner leads 300 may be positioned on a peripheral portion of the die pad 200, and the other end may be connected to the outer leads 110.

The ends of the inner leads 300 may constitute inner lead connection surfaces 301 parallel with the four pairs of parallel sides of the die pad 200. The inner lead connection surfaces 301 may constitute 8 surfaces. The inner lead connection surfaces 301 may form an obtuse angle $\theta2$ equal to the obtuse angle $\theta1$ made by the four pairs of parallel sides of the die pad 200 ($\angle\theta1=\angle\theta2$).

Isolation frames 250 extending by a predetermined or given length to an end portion of the lead frame from the circumference of the die pad 200 may be formed on the circumference of the die pad 200. A space angle $\gamma$ may be formed between either two isolation frames 250 about the center O of the die pad 200. The space angle $\gamma$ may be a right angle. For example, a central axis line C of the isolation frame 250 may be at an angle to the sides of the die pad 200. Each of the isolation frames 250 may extend by a predetermined or given length toward an end of the lead frame 100 from a central portion of the two pairs of parallel sides, with a first length L1, of the die pad 200. The inner leads 300 may be divided into four regions a, b, c and d by the isolation frames 250.

Locking holes 251 having different sizes may be provided in each of the isolation frames 250. The locking holes 251 may pass through top and bottom surfaces of the isolation frame 250, or may be provided in the shape of grooves on the top/bottom surface of the isolation frame 250. The locking holes 251 may be symmetric with respect to the central axis line C of the isolation frame 250. As shown in FIGS. 2 and 3, each of the locking holes 251 may be provided in a predetermined or given length to form an acute angle $\alpha$ with the side of the die pad 200. The locking holes 251 may be provided to have different lengths, and may be symmetric with respect to the central axis line C of the isolation frame 250. Thus, the locking holes may be provided in a manner resembling the teeth of a comb with respect to the central axis line C of the isolation frame 250.

As shown in FIG. 4, locking holes 252 may be provided to be symmetric with respect to the central axis line C of the isolation frame 250 toward the other end of the lead frame 100 from one end thereof. The locking holes 252 may be circular holes with different sizes.

Referring to FIGS. 3 and 5, the square-shaped semiconductor chip 150 adhered to a top surface of the die pad 200 with an adhesive 201 may include a plurality of connection contact points 151 and may be formed along the edge surfaces of the semiconductor chip 150 at the edge portions thereof. For example, the connection contact points 151 may be formed on the four surfaces of the semiconductor chip 150. An arrangement line 151a of the connection contact points 151 may be formed in parallel with the edge surface of the semiconductor chip 150.

Thus, the square-shaped semiconductor chip 150 may be positioned such that the two pairs of edge surfaces may be parallel with any two pairs of parallel sides of the die pad 200. The adhesive 201 may be coated between the semiconductor chip 150 and the die pad 200, so that the semiconductor chip 150 may be adhered to the top surface of the die pad 200 by the adhesive 201. Thus, when the square-shaped semiconductor chip 150 is seated on the die pad 200 according to example embodiments, the semiconductor chip 150 may be positioned at an interval of about 45 degrees from the center O of the die pad 200 to be positioned. For example, the semiconductor chip 150 may be positioned toward any one of the four directions from the center O of the die pad 200.

Therefore, the edge surfaces of the semiconductor chip 150 and the parallel sides of the die pad 200 may be parallel with each other. The edge surface of the semiconductor chip 150 may be parallel with the inner lead connection surface 301 of the inner leads 300. The connection contact points 151 of the semiconductor chip 150 may be electrically connected to ends of the inner leads 300 through gold wires 170. Ends of the wires 170 may be bonded to the connection contact points 151 of the semiconductor chip 150, and the other ends of the wires 170 may be bonded to ends of the inner leads 300. The bonding process may be performed using a wire bonder (not shown).

As shown in FIG. 3, the wire 170 may be at an angle to the inner lead connection surface 301 of the inner leads 300. Accordingly, when the wires 170 are connected to the connection contact points 151 of the semiconductor chip 150 and the inner leads 300, connection angles of the wires 170 may be reduced. A physical contact between the wires 170 may be eliminated so that an electrical short phenomenon due to the contact between the wires 170 may be prevented or reduced.

When the wire bonding is completed in such a manner, a molding resin 400 may be supplied to the top and bottom surfaces of the lead frame 100. The molding resin 400 may fill and cover the top/bottom surface of the lead frame 100. The molding resin 400 may be filled in the locking holes 251 provided in the isolation frames 250. Because the plurality of locking holes 250 are provided to have different sizes in the isolation frames 250, the physical contact area of the locking holes 250 with the molding resin 400 may be increased.

When the molding resin 400 is molded in this state, the molding resin 400 may be filled in the locking holes 251 and may easily fix the isolation frames 250 at a plurality of positions. When the molding resin 400 is filled in the locking holes 251 and molded, the locking holes 251 may prevent or reduce the lead frame 100 from being distorted in all directions. The locking holes 251 may be provided to be symmetric with each other from the central axis line C of the isolation frame 250. Further, the locking holes 251 may have different lengths and may form an acute angle with the parallel sides of the die pad 200.

In example embodiments, the semiconductor device has been described, in which the die pad 200 may be formed on the central surface of the lead frame 100, and one semiconductor chip 150 may be attached to the die pad 200. However, example embodiments may also include a semiconductor device in which another semiconductor chip 150-1 is attached on the other surface of the die pad 200 as shown in FIG. 6, including a semiconductor device that may include one semiconductor chip as above.

In this case, inner leads 300 and outer leads 110 having the same configuration as described with reference to FIGS. 2-5 may be formed on the other surface of the lead frame 100. For example, other example embodiments, which are shown in FIG. 6, may have a die pad 200 positioned at a central portion of the lead frame 100. When semiconductor chips 150 and 150-1 are attached to both surfaces of the die pad 200, a die attachment operation may be performed through wires 170 as described with reference to FIGS. 2-5.

Thus, referring to FIG. 6, the semiconductor chips 150 and 150-1 attached to both sides of the die pad 200 may be positioned at different angles to be positioned on the corresponding surfaces of the die pad 200. Wire bonding may be performed with respect to each of the semiconductor chips 150 and 150-1.

Figure 7:
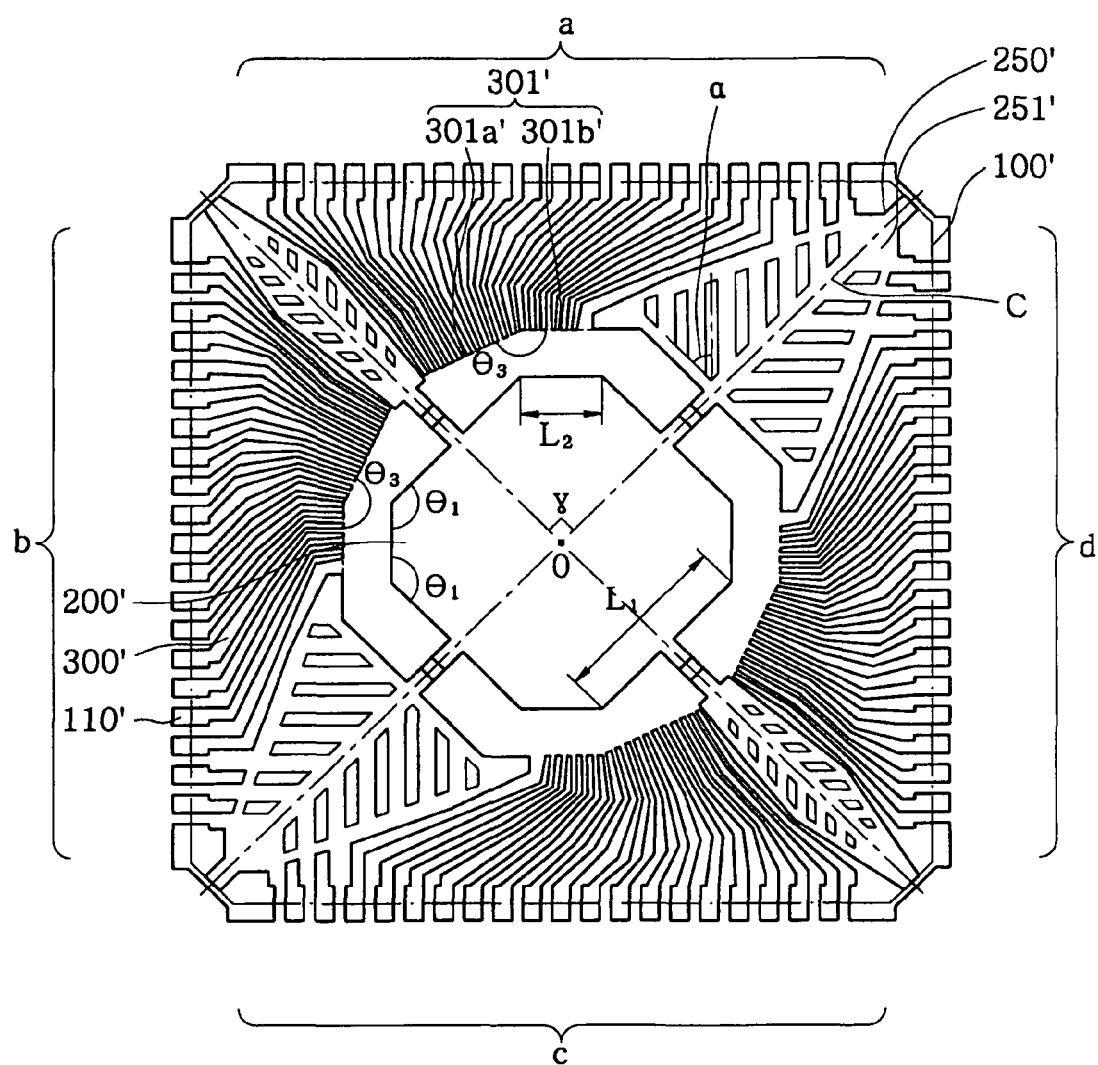
Figure 8:
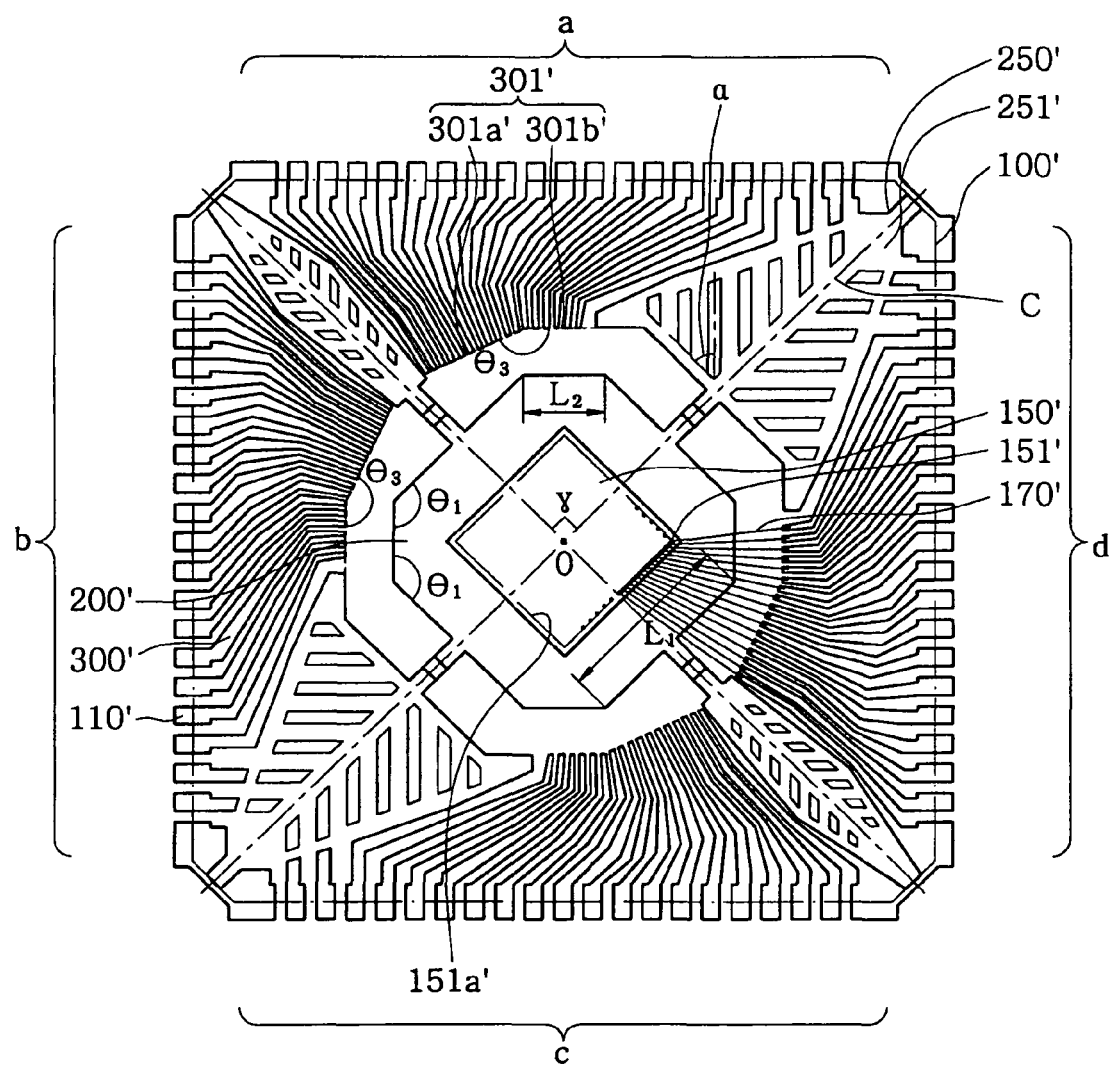
Figure 9:
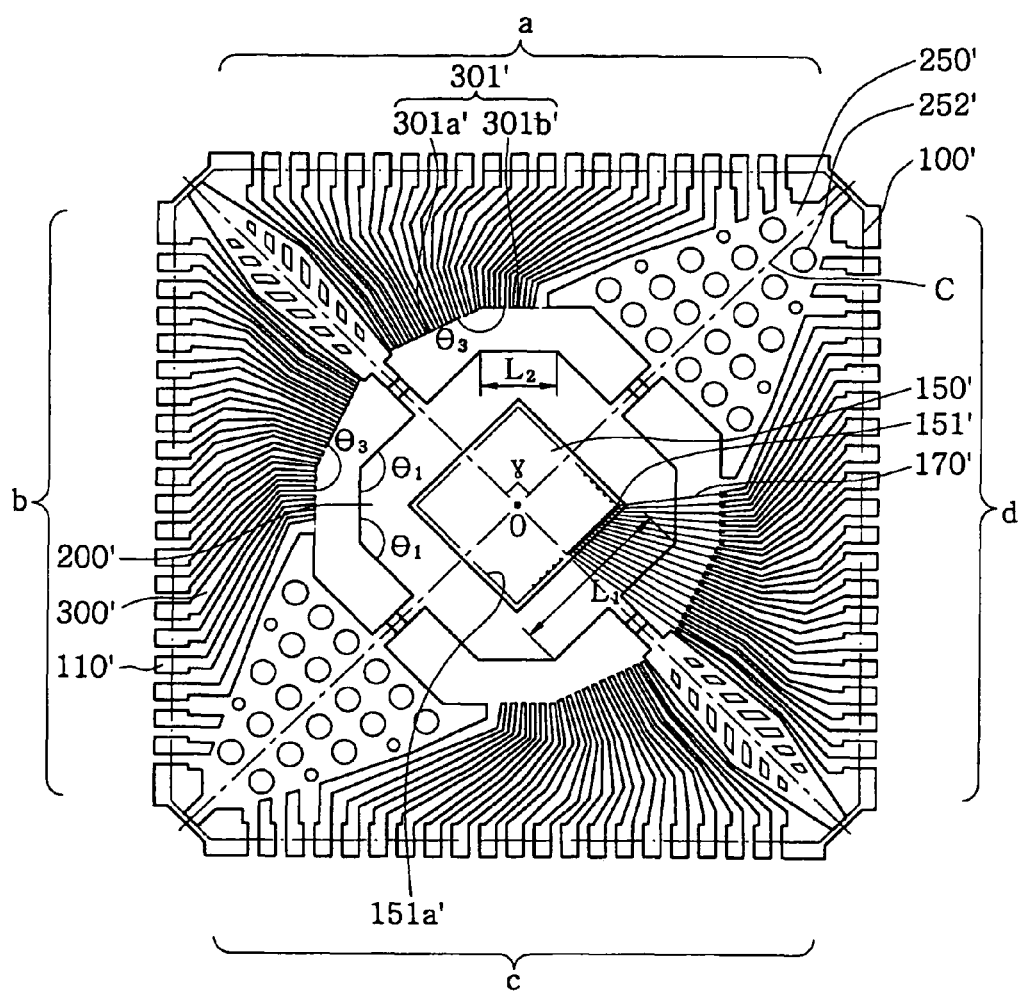

FIG. 7 is a plan view of a lead frame according to example embodiments. FIG. 8 is a plan view of a semiconductor device having a lead frame according to example embodiments. FIG. 9 is a plan view of another example of a locking hole according to example embodiments. FIG. 10 is a cross-sectional view of the semiconductor device having a lead frame according to example embodiments. FIG. 11 is a cross-sectional view of another example of a semiconductor device having a lead frame according to example embodiments. Referring to FIGS. 7 and 8, the semiconductor device according to example embodiments may include a lead frame 100' including a plurality of outer leads 110' provided at an outer circumference thereof. The lead frame 100' may be formed in the shape of a quadrangle or square having four surfaces.

A die pad 200' having a semiconductor chip 150' positioned thereon may be positioned at a central portion of the lead frame 100'. The semiconductor chip may include three or more pairs of sides parallel with each other and connection contact points 151' formed on a top surface of the semiconductor chip. The die pad 200' may have four pairs of sides parallel with each other. Thus, the die pad 200' may be formed into at least hexagonal shape. Each of the two pairs of parallel sides facing each other in the die pad 200' may have a first length L1, and each of the other two pairs of parallel sides may have a second length L2. The first length L1 may be identical with or different from the second length L2. The first length L1 may be longer than the second length L2 as shown in FIG. 7.

The four pairs of parallel sides in the die pad 200' may form an obtuse angle θ1 with each other. A plurality of inner leads 300' positioned to be spaced apart from a circumference of the die pad 200' at a predetermined or given interval may be provided at the circumference thereof. The inner leads 300' may be arranged in a radial shape from the center O of the die pad 200'. The inner leads 300' may have predetermined or given lengths to be connected to the outer leads 110'. Ends of each of the inner leads 300' may be positioned at the peripheral portion of the die pad 200', and the other ends thereof may be connected to the outer leads 110'.

Ends of the respective inner leads 300' may constitute inner lead connection surfaces 301' formed to form an obtuse angle θ3 greater than the obtuse angle θ1 made by the four pairs of parallel sides of the die pad 200'. Each of the inner lead connection surfaces 301' may include a first inner lead connection surface 301a' and a second inner lead connection surface 301b' connected thereto. The first and second inner lead connection surfaces 301a' and 301b' may form the obtuse angle θ3. For example, the inner lead connection surfaces 301' of the inner leads 300' may be formed at positions corresponding to any one pair of parallel sides in the die pad 200' formed to be inclined with respect to the other pair of parallel sides. Isolation frames 250' may extend by a predetermined or given length to an end portion of the lead frame 100' from the circumference of the die pad 200' and may be formed at the circumference thereof.

The isolation frames 250' may form a same space angle γ between any two of them about the center O of the die pad 200'. The space angle γ may be an angle. For example, a central axis line C of the isolation frame 250' may be at an angle to the sides of the die pad 200'. Each of the isolation frames 250' may extend by a predetermined or given length toward an end of the lead frame 100' from a central portion of the two pairs of parallel sides of the die pad 200'.

The inner leads 300' may be divided into four regions a, b, c and d by the isolation frames 250'. Locking holes 251' may have different sizes that are provided in each of the isolation frames 250'. The locking holes 251' may pass through top and bottom surfaces of the isolation frame 250', or may be provided in the shape of grooves on the top/bottom surface of the isolation frame 250'. The locking holes 251' may be provided to be symmetric with each other with respect to the central axis line C of the isolation frame 250'. Each of the locking holes 251' may be provided in a predetermined or given length to form an acute angle α to the side of the die pad 200'. The locking holes 251' may be provided to have different lengths, and may be symmetric with respect to the central axis line C of the isolation frame 250'.

As shown in FIG. 9, locking holes 252' may be provided to be symmetric with each other with respect to the central axis line C of the isolation frame 250' along the other end of the lead frame 100' from one end thereof. The locking holes 252' may be circular holes with different sizes. Referring to FIG. 8, the square-shaped semiconductor chip 150' adhered to a top surface of the die pad 200' through an adhesive 201' may include a plurality of connection contact points 151' formed along two edge surfaces of the semiconductor chip 150' at edge portions thereof. For example, the connection contact points 151' may be formed on the other pair of parallel surfaces in two pairs of parallel surfaces of the semiconductor chip 150'. An arrangement line 151a' of the connection contact points 151' may be formed to be parallel with the other pair of parallel surfaces in the semiconductor chip 150'.

Thus, the square-shaped semiconductor chip 150' may be positioned such that a pair of edge surfaces having the connection contact points 151' formed thereon may be parallel with any one pair of parallel sides of the die pad 200'. For example, the connection contact points 151' may be arranged toward a direction in which ends of the inner leads 300' may be formed.

The adhesive 201' may be coated between the semiconductor chip 150' and the die pad 200', so that the semiconductor chip 150' may adhere to the top surface of the die pad 200' by the adhesive 201'. Thus, when the square-shaped semiconductor chip 150' is seated on the die pad 200' according to example embodiments, the semiconductor chip 150' may be positioned at an interval of about 45 degrees from the center O of the die pad 200' to be positioned. For example, the semiconductor chip 150' may be positioned toward any one of the four directions from the center O of the die pad 200'.

Therefore, the edge surfaces of the semiconductor chip 150' and the parallel sides of the die pad 200' may be parallel with each other. Each of the inner lead connection surfaces 301' of the inner leads 300' may be formed to be distant from the parallel side of the die pad 200' as it approaches from both ends of the parallel side of the die pad 200' to a central portion thereof. In this state, the connection contact points 151' of the semiconductor chip 150' may be electrically connected to the ends of the inner leads 300' through gold wires 170'. Ends of the wires 170' may be bonded to the connection contact points 151' of the semiconductor chip 150', and the other ends of the wires 170' may be bonded to the ends of the inner leads 300'. The bonding process may be performed with a wire bonder (not shown).

As shown in FIG. 8, the wire 170' may be at an angle to the inner lead connection surface 301' of the inner leads 300'. Accordingly, when the wires 170' are connected to the connection contact points 151' of the semiconductor chip 150' and the inner leads 300', connection angles of the wires 170' may be reduced. A physical contact between the wires 170' may be eliminated, so that an electrical short phenomenon due to the contact between the wires 170' may be prevented or reduced. When the wire bonding is completed in such a manner, a molding resin 400' may be supplied to the top/bottom surface of the lead frame 100' as shown in FIGS. 10 and 11. The molding resin 400' may fill and cover the top/bottom surface of the lead frame 100'.

The molding resin 400' may be filled in the locking holes 251' provided in the isolation frames 250'. Because the plurality of locking holes 250' may be provided to have different sizes in the isolation frames 250', the physical contact area of the locking holes 250' with the molding resin 400' may be increased.

When the molding resin 400' is molded in this state, the molding resin 400' filled in the locking holes 251' may more easily fix the isolation frames 250' at a plurality of positions. When the molding resin 400' is filled in the locking holes 251' and molded, the locking holes 251' may prevent or reduce the lead frame 100' from being distorted in all directions. The locking holes 251' may be provided to be symmetric with each other from the central axis line C of the isolation frame 250' and have different lengths. Further, the locking holes 251' may form an acute angle to the parallel sides of the die pad 200'.

In example embodiments, the semiconductor device has been described, in which the die pad 200' may be formed on a central surface of the lead frame 100', and one semiconductor chip 150' may be attached to the die pad 200'. However, example embodiments may also include a semiconductor device in which another semiconductor chip 150-1' may be attached on the other surface of the die pad 200' as shown in FIG. 11, including a semiconductor device having one semiconductor chip.

In example embodiments, inner leads 300' and outer leads 110' having the same configuration as described with reference to FIGS. 7 through 9 may be formed on the other surface of the lead frame 100'. For example, other example embodiments may have a die pad 200' positioned at a central portion of the lead frame 100'. When semiconductor chips 150' and 150-1' are attached to one and the other surfaces of the die pad 200', a die attachment operation may be performed through wires 170' as described with reference to FIGS. 7 through 9.

Thus, as described in example embodiments, the semiconductor chips 150' and 150-1' attached to both sides of the die pad 200' may be positioned at different angles to be positioned on the corresponding surfaces of the die pad 200'. Wire bonding may be performed with respect to each of the semiconductor chips 150' and 150-1'.

As described above, example embodiments may have an advantage in that a die pad may be formed to have four pairs of parallel sides, and inner lead connection surfaces of inner leads may be formed to be spaced apart from and parallel with the parallel sides, so that a semiconductor chip may be selectively positioned at an interval about 45 degrees from the center of the die pad to be attached thereto. Further, example embodiments may have an advantage in that wires connected to a semiconductor chip may be formed to be at an angle to inner lead connection surfaces of inner leads, so that the connection angles of the wires may be reduced, and a constant interval may be set between the wires, so that an interference between the wires may be reduced. Accordingly, an electrical short phenomenon may be prevented or reduced, thereby lowering a product failure rate.

Furthermore, example embodiments may have an advantage in that, when coating a molding resin on a lead frame to form a mold, locking holes of different sizes may be provided in an isolation frame, so that a bonding force between the top and bottom of the molding resin around the lead frame may be increased, thereby preventing or reducing the mold from being lifted out of the lead frame.

While example embodiments have been particularly shown and described with reference to example embodiments thereof, it will be understood by those of ordinary skill in the art that various changes in form and details may be made therein without departing from the spirit and scope of the following claims.

What is claimed is:

1. A lead frame comprising:
a die pad;
a plurality of inner leads spaced apart from a circumference of the die pad; and
a plurality of isolation frames extending outwardly from the circumference of the die pad, the plurality of isolation frames having various widths,
wherein the die pad is substantially octagonal shaped having four first sides of a first length and four second sides of a second length,
the first length being longer than the second length,
wherein the plurality of isolation frames straightly extend from corners of the lead frame to said first sides of the die pad, and
wherein the plurality of isolation frames are perpendicular to said first sides.

2. The lead frame according to claim 1, wherein the first and the second sides of the die pad include four pairs of sides parallel with each other.

3. The lead frame according to claim 1, wherein the plurality of inner leads are arranged in a radial shape with respect to a center of the die pad, the plurality of inner leads include ends forming inner lead connection surfaces parallel with at least one pair of sides of the die pad.

4. The lead frame according to claim 3, wherein the inner lead connection surfaces form an obtuse angle with each other.

5. The lead frame according to claim 4, further comprising:
a plurality of locking holes passing through top and bottom surfaces of the plurality of isolation frames,
the plurality of locking holes having different sizes,
wherein the different sizes of the locking holes correspond to the various widths of the plurality of isolation frames.

6. The lead frame according to claim 5, wherein the plurality of isolation frames include central axis lines, and the plurality of locking holes are in a shape of teeth of a comb with respect to the central axis lines of the plurality of isolation frames.

7. The lead frame according to claim 1, further comprising:
a semiconductor chip on the die pad,
wherein an outermost perimeter of the lead frame is substantially rectangular in shape and an outermost perimeter of the semiconductor chip is substantially rectangular in shape.

8. A semiconductor device, comprising:
a lead frame having an outermost perimeter being substantially rectangular in shape wherein the lead frame comprises,
a plurality of outer leads provided at an outer circumference of the lead frame;
a die pad positioned on a central portion of one surface of the lead frame,
the die pad including at least four pairs of sides parallel with each other,
the four pairs of sides including four first sides of a first length and four second sides of a second length,
the first length being longer than the second length; and
a plurality of isolation frames straightly extending from corners of the lead frame to sides of the die pad, wherein the plurality of isolation frames are perpendicular to the first sides of the die pad, respectively, and
a semiconductor chip on the die pad, the semiconductor chip having an outermost perimeter being substantially rectangular in shape,
wherein at least two sides of the die pad and the semiconductor chip are in parallel with each other.

9. The semiconductor device according to claim 8, wherein the plurality of inner leads are connected to the outer leads.

10. The semiconductor device according to claim 8, wherein the plurality of inner leads are electrically connected to the semiconductor chip by wires.

11. The semiconductor device according to claim 10, wherein the plurality of inner leads includes ends forming inner lead connection surfaces parallel with at least one pair of sides of the die pad and each of the wires is at an angle to the inner lead connection surfaces of the inner leads.

12. The semiconductor device according to claim 8, wherein the first sides and the second sides of the die pad form an obtuse angle.

13. The semiconductor device according to claim 8, further comprising:
connection contact points are at two edge portions of the semiconductor chip.

14. The semiconductor device according to claim 8, further comprising:
a plurality of locking holes passing through top and bottom surfaces of the isolation frames,
wherein the locking holes have different sizes,
wherein the different sizes of the locking holes correspond to various widths of isolation frames, and
wherein the locking holes form an acute angle with the sides of the die pad.

15. The semiconductor device according to claim 14, wherein the plurality of isolation frames include central axis lines, and the locking holes are in a shape of teeth of a comb with respect to the central axis lines of the plurality of isolation frames.

16. The semiconductor device according to claim 8,
wherein the semiconductor chip is on a top surface of the die pad, and
the semiconductor device further includes:
a another semiconductor chip on a bottom surface of the die pad, and
a molding resin surrounding the top surface and the bottom surface of the die pad.

17. The semiconductor device according to claim 8, wherein the plurality of inner leads are arranged in a radial shape with respect to a center of the die pad, the plurality of inner leads includes ends forming inner lead connection surfaces parallel with at least one pair of sides of the die pad.

18. The semiconductor device according to claim 17, wherein each of the inner lead connection surfaces of the inner leads is at a position corresponding to any one pair of parallel sides of the die pad to be inclined with respect to another pair of parallel sides of the die pad, and wherein the inner lead connection surfaces form an obtuse angle.

19. A lead frame comprising:
a die pad having four first sides and four second sides, wherein the first sides are longer than the second sides; and
a plurality of inner leads surrounding the die pad,
wherein an outermost perimeter of the lead frame is substantially rectangular,
wherein the outermost perimeter of the lead frame has at least four sides; and
wherein the first sides of the die pad are rotated 45 degrees with respect to the sides of the outer perimeter of the lead frame.

20. The lead frame according to claim 19, wherein the second sides of the die pad and the sides of the outermost perimeter of the lead frame are in parallel with each other, respectively.

21. The lead frame according to claim 20, further comprising:
a plurality of isolation frames extending from the first sides of the die pad to corners of the outermost perimeter of the lead frame.

22. The lead frame according to claim 21, further comprising:
a plurality of locking holes passing through top to bottom surfaces of the isolation frames,
wherein at least two of the locking holes symmetrically positioned across an imaginary center axis line of two isolation frames.

23. The lead frame according to claim 22, wherein the imaginary center axis line extends between two opposite corners of the outermost perimeter of the lead frame.

* * * * *